United States Patent
Lin

(10) Patent No.: US 9,413,374 B2
(45) Date of Patent: Aug. 9, 2016

(54) METHOD AND APPARATUS FOR CALIBRATING COMPARATOR OFFSET OF SUCCESSIVE-APPROXIMATION-REGISTER ANALOG-TO-DIGITAL CONVERTER

(71) Applicant: Realtek Semiconductor Corp., HsinChu (TW)

(72) Inventor: Chia-Liang Leon Lin, Fremont, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/508,375

(22) Filed: Oct. 7, 2014

(65) Prior Publication Data

US 2016/0099722 A1   Apr. 7, 2016

(51) Int. Cl.
  *H03M 1/06*   (2006.01)
  *H03M 1/12*   (2006.01)
  *H03M 1/46*   (2006.01)

(52) U.S. Cl.
  CPC .......... *H03M 1/0612* (2013.01); *H03M 1/0607* (2013.01); *H03M 1/1245* (2013.01); *H03M 1/466* (2013.01)

(58) Field of Classification Search
  None
  See application file for complete search history.

(56) References Cited

U.S. PATENT DOCUMENTS

| | | | | |
|---|---|---|---|---|
| 5,831,562 A * | 11/1998 | Van Auken | ......... | H03M 1/0682 327/94 |
| 7,432,844 B2 * | 10/2008 | Mueck | ............... | H03M 1/0682 341/161 |
| 7,876,254 B2 * | 1/2011 | Berens | ............... | H03M 1/0682 341/144 |
| 9,106,243 B2 * | 8/2015 | Lee | ..................... | H03M 1/1023 |
| 2009/0121907 A1 * | 5/2009 | Kuramochi | ......... | H03M 1/1047 341/120 |

* cited by examiner

*Primary Examiner* — Howard Williams
(74) *Attorney, Agent, or Firm* — Sughrue Mion, PLLC

(57) ABSTRACT

A circuit and method compensates for comparator offset in a successive approximation register analog-to-digital converter. The circuit includes a multiplexed sampler to sample either a common mode voltage or an input signal. The sampled signal is added to a conversion voltage and an offset correction voltage and input to a comparator. The comparator determines a polarity of deviation of the sum of the sampled signal, conversion voltage and off-set correction voltage. Based on the polarity, the offset correction voltage and the conversion voltage are alternately subjected to a successive approximation process to compensate for the offset of the sum from the sampled input signal or sampled common voltage signal.

18 Claims, 5 Drawing Sheets

METHOD AND APPARATUS FOR CALIBRATING COMPARATOR OFFSET OF SUCCESSIVE-APPROXIMATION-REGISTER ANALOG-TO-DIGITAL CONVERTER

BACKGROUND OF THE INVENTION

1. Field of the Invention

The present invention generally relates to calibrating a comparator offset of a successive-approximation-register (SAR) analog-to-digital converter (ADC).

2. Description of Related Art

Persons of ordinary skill in the art understand terms and basic concepts related to microelectronics that are used in this disclosure, such as "signal," "sampling," "circuit node," "switch," "comparator," "finite-state machine," "analog-to-digital converter (ADC)," and "digital-to-analog converter (DAC)." Terms and basic concepts like these are understood by those of ordinary skill in the art and thus will not be explained in detail here.

A functional block diagram of a successive-approximation-register (SAR) analog-to-digital converter (ADC) 100 is shown in FIG. 1A. SAR ADC 100 comprises: a sampling network 110 sampling an input voltage $V_{IN}$ and outputting a first voltage $V_1$ in accordance with a sampling signal SAMP; a digital-to-analog converter (DAC) 120 converting an output data $D_O$ into a second voltage $V_2$; a summing circuit 130 receiving the first voltage $V_1$ and the second voltage $V_2$ and outputting a summed voltage $V_X$; a comparator 140 receiving the summed voltage $V_X$ and outputting a binary decision $D_X$ indicating a polarity of the summed voltage $V_X$; and a SAR controller 150 receiving the binary decision $D_X$ and outputting the sampling signal SAMP and the output data $D_O$. SAR ADC 100 operates in two phases: a sampling phase and a conversion phase. In the sampling phase, the sampling signal SAMP is asserted, and the input voltage $V_{IN}$ is sampled into the first voltage $V_1$. In the conversion phase, the sampling signal SAMP is de-asserted, and the SAR controller 150 conducts a process of successive approximation to adapt the output data $D_O$ to make the second voltage $V_2$ approximately equal to the first voltage $V_1$ in accordance with the binary decision $D_X$. The SAR controller 150 increases a value of the output data $D_O$ to raise the second voltage $V_2$ and thus lower the summed voltage $V_X$ when the binary decision $D_X$ is 1, indicating that the summed voltage $V_X$ is too high and needs to be lowered. Otherwise the SAR controller 150 decreases the value of the output data $D_O$ to lower the second voltage $V_2$ and thus raise the summed voltage $V_X$. At the end of the process of successive approximation, the summed voltage $V_X$ is approximately zero, the second voltage $V_2$ is approximately equal to the first voltage $V_1$, and a final value of the output data $D_O$ is a digital representation of the input voltage $V_{IN}$ as a result of the successive approximation.

Ideal transfer characteristics of comparator 140 is shown in FIG. 1B. As shown, $D_X$ is 1 when $V_X$ is greater than 0. Otherwise, $D_X$ is 0. A practical comparator, however, might have an offset. Exemplary transfer characteristics of comparator 140 with a 10 mV offset is shown in FIG. 1C. As shown, $D_X$ is 1 when $V_X$ is greater than 10 mV; otherwise, $D_X$ is 0. In the presence of offset (e.g., 10 mV) of comparator 140, the summed voltage $V_X$ is approximately equal to the offset voltage (e.g., 10 mV), instead of zero, at the end of the successive approximation. As a result, the second voltage $V_2$ might not be an accurate approximation to the first voltage $V_1$, and the final value of the output data $D_O$ might not be an accurate digital representation of the input voltage $V_{IN}$. This introduces an error to the analog-to-digital conversion and degrades a performance of SAR ADC 100.

Comparator offset can be calibrated by using an "auto-zero" scheme. An "auto-zero" scheme, however, increases complexity of the comparator.

What is desired is a method for calibrating the comparator offset of SAR ADC without increasing complexity of the comparator.

BRIEF SUMMARY OF THE INVENTION

An object of an exemplary embodiment of the present invention is to calibrate a voltage offset of a comparator of a successive-approximation-register analog-to-digital converter.

An object of an exemplary embodiment of the present invention is to cancel a voltage offset of a comparator of a successive-approximation-register analog-to-digital converter using an offset-correction digital-to-analog converter in response to an offset-correction code obtained using successive approximation.

In an exemplary embodiment, a successive-approximation-register analog-to-digital converter comprises: a multiplexed sampling network sampling either an input voltage or a common-mode voltage into a sampled voltage in accordance with a sampling signal, and based on the status of a foreground calibration indicator; a first digital-to-analog converter outputting a conversion voltage in response to a conversion code; a second digital-to-analog converter outputting an offset-correction voltage in response to an offset-correction code; a summing circuit receiving the sampled voltage, the conversion voltage, and the offset-correction voltage and outputting an error voltage; a comparator receiving the error voltage and outputting a binary decision; and a successive-approximation-register finite state machine receiving the binary decision and outputting an output data, the sampling signal, the foreground calibration indicator, the conversion code, and the offset-correction code, wherein: the finite state machine includes a foreground calibration state and a normal operation state. When the finite state machine is in the foreground calibration state, the common-mode voltage is sampled, and the conversion code is set to a common-mode code, and a calibrated value of the offset-correction code is established by successive approximation. In contrast, when the finite state machine is in the normal operation state, the input voltage is sampled, the offset-correction code is set to the calibrated value obtained when the state machine is in the foreground calibration state, and the conversion code is established by successive approximation. In an exemplary embodiment, a resolution of the second digital-to-analog converter is higher than a resolution of the first digital-to-analog converter.

In an exemplary embodiment, a method comprises: using a first digital-to-analog converter to generate a conversion voltage in response to a conversion code; using a second digital-to-analog converter to generate an offset-correction voltage in response to an offset-correction code; using a summing circuit to generate an error voltage representing a sum of a sampled voltage, the conversion voltage, and the offset-correction voltage; using a comparator to output a binary decision indicating a polarity of the error voltage; and performing a first successive approximation including: setting the conversion code to a common-mode code; setting the offset-correction code to a neutral code; sampling a common-mode voltage into the sampled voltage; iteratively adapting the offset-correction code in accordance with the binary decision using successive approximation; saving a final value of the offset-correction code as a calibrated value; and performing a second successive approximation including: setting the offset-correction code to the neutral code; setting the conversion code to the common-mode code; sampling an input voltage into the sampled voltage; setting the offset-correction code to the calibrated value obtained when performing the first of successive approximation; iteratively adapting the conversion code in accordance with the binary decision using successive approximation; and outputting an output data using a final value of the conversion code.

DETAILED DESCRIPTION OF THE INVENTION

The present invention relates to calibration of a comparator offset of a successive-approximation-register analog-to-digital converter. While the specification describes several exemplary embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

The present invention is disclosed in an "engineering sense," wherein a first quantity is said to be "equal to" a second quantity if a difference between the first quantity and the second quantity is smaller than a given tolerance. The amount of appropriate tolerance would be understood by one of ordinary skill. For example, 100.2 mV is said to be equal to 100 mV if the given tolerance is 0.5 mV. Likewise, a physical quantity is said to be pre-determined if the physical quantity is established by engineering means so as to be equal to a pre-determined value in the engineering sense. For instance, a voltage is said to be pre-determined if it is generated by an apparatus so that the voltage is equal to a pre-determined value (say, 100 mV). Transfer characteristics of a device are said to be pre-known if an output of the device in response of a given input of the device is pre-determined by engineering means.

Figure 2:
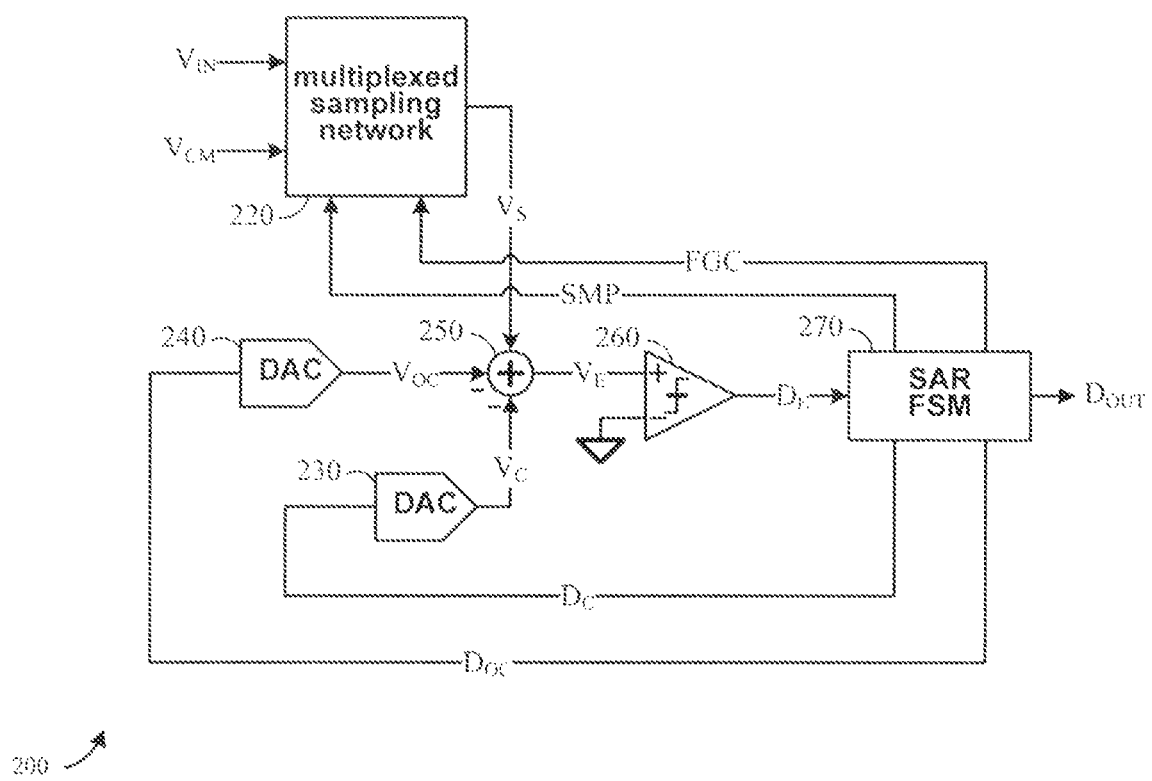
FIG. 2 shows a functional block diagram of a SAR ADC in accordance with an exemplary embodiment of the present invention.

A functional block diagram of a successive-approximation-register (SAR) analog-to-digital converter (ADC) 200 in accordance with an embodiment of the present invention is shown in FIG. 2. SAR ADC 200 includes: a multiplexed sampling network 220 receiving an input voltage $V_{IN}$ and a common-mode voltage $V_{CM}$ and outputting a sampled voltage $V_S$ in accordance with a sampling signal SMP and based on the status of a foreground calibration indicator FGC. A first DAC (digital-to-analog converter) 230 receives a conversion code $D_C$ and outputs a conversion voltage $V_C$. A second DAC 240 receives an offset-correction code $D_{OC}$ and outputs an offset-correction voltage $V_{OC}$. A summing circuit 250 receives the conversion voltage $V_C$, the offset-correction voltage $V_{OC}$, and the sampled voltage $V_S$ and outputs an error voltage $V_E$. A comparator 260 receives the error voltage $V_E$ and outputs a binary decision $D_E$. An SAR FSM (finite-state machine) 270 receives the binary decision $D_E$ and outputs an output data $D_{OUT}$, the sampling signal SMP, the foreground calibration indicator FGC, the conversion code $D_C$, and the offset-correction code $D_{OC}$. The function of the summing circuit 250 can be expressed by the following equation:

$$V_E = V_S - V_C - V_{OC}. \quad (1)$$

Figure 1A:
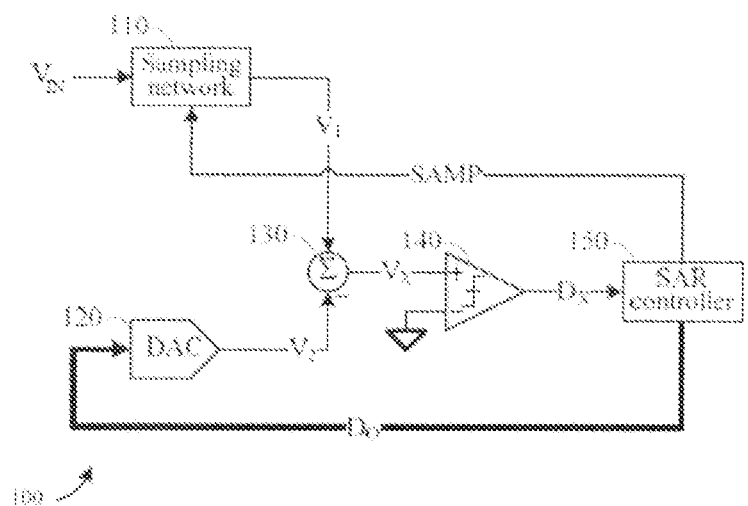
FIG. 1A shows a functional block diagram of a prior art successive-approximation-register (SAR) analog-to-digital converter (ADC).
Figure 1B:
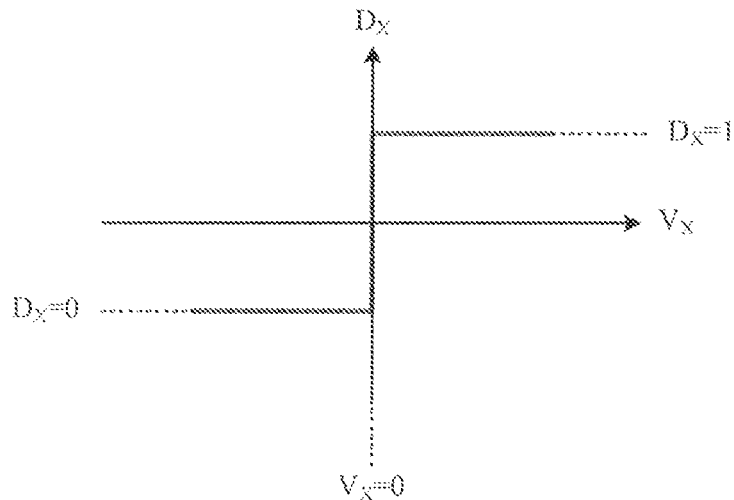
FIG. 1B shows ideal transfer characteristics of a comparator of the SAR ADC of FIG. 1A.
Figure 1C:
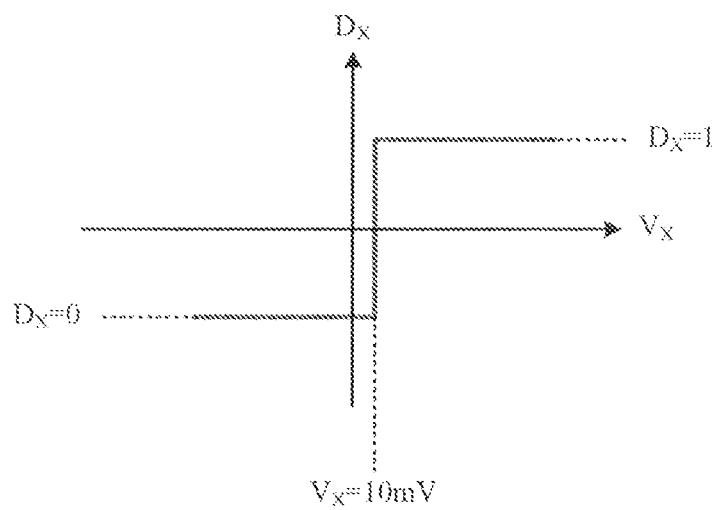
FIG. 1C shows exemplary transfer characteristics of a comparator of the SAR ADC of FIG. 1A with 10 mV offset.

SAR ADC 200 has two states: foreground calibration, and normal operation. When the foreground calibration indicator FGC is asserted, SAR ADC 200 is in the foreground calibration state; otherwise SAR ADC 200 is in the normal operation state. Regardless of the state, SAR ADC 200 performs analog-to-digital conversion in two phases: a sampling phase and a conversion phase. When the sampling signal SMP is asserted, SAR ADC 200 is in the sampling phase. Otherwise SAR ADC 200 is in the conversion phase. In the sampling phase, either $V_{CM}$ or $V_{IN}$ is sampled into the sampled voltage $V_S$. In the conversion phase, either $D_{OC}$ or $D_C$ is iteratively adapted by the SAR FSM 270 in accordance with $D_E$. At the end of the conversion phase, the error voltage $V_E$ will be approximately equal to zero if the comparator 260 is without offset (e.g., see FIG. 1B, with $V_X$ and $D_X$ being replaced by $V_E$ and $D_E$, respectively). Otherwise the comparator 260 has a nonzero offset voltage (e.g., see FIG. 1C, with $V_X$ and $D_X$ being replaced by $V_E$ and $D_E$, respectively), and $V_E$ will be approximately equal to the offset voltage of the comparator 260. Let the offset voltage of the comparator 260 be $V_{OS}$. The foreground calibration is used to estimate the offset voltage $V_{OS}$.

The common-mode voltage $V_{CM}$ is a pre-determined voltage that serves as a reference for calibrating SAR ADC 200 in the foreground calibration state. Transfer characteristics of DAC 230 are pre-determined such that $V_C$ is equal to $V_{CM}$ when $D_C$ is set to a determined common-mode code $D_{CM}$. Transfer characteristics of DAC 240 are also pre-determined such that $V_{OC}$ is equal to 0V when $D_{OC}$ is set to a neutral code $D_{OC0}$. In the foreground calibration state, during the sampling phase, $D_C$ is set to $D_{CM}$, $D_{OC}$ is set to $D_{OC0}$, and $V_{CM}$ is sampled into $V_S$. In the foreground calibration state, during the conversion phase, $D_{OC}$ is iteratively adapted by SAR FSM 270 in accordance with $D_E$ as follows. SAR FSM 270 increases $D_{OC}$ to raise $V_{OC}$ and thus lower $V_E$ when $D_E$ is 1. Otherwise SAR FSM 270 decreases $D_{OC}$ to lower $V_{OC}$ and thus raise $V_E$. At the end of the conversion phase after the successive approximation, $V_E$ is approximately equal to the offset voltage $V_{OS}$ of comparator 260 (due to the successive approximation), and therefore $V_{OC}$ is approximately equal to $-V_{OS}$, per Equation (1) along with using the conditions that $V_S = V_{CM}$ (due to the sampling), and $V_E = V_{OS}$ (due to the successive approximation). Let the final value of $D_{OC}$ at the end of the conversion phase of the foreground calibration state be $D_{OCC}$, which is a calibrated value for $D_{OC}$ that makes $V_{OC}$ approximately equal to $-V_{OS}$. After the calibrated value $D_{OCC}$ is obtained, SAR ADC 200 can enter the normal operation state, wherein the foreground calibration indicator FGC is de-asserted. In the normal operation state, $D_{OC}$ is set to the neutral value $D_{OC0}$, $D_C$ is set to the common-mode code $D_{CM}$, and the input voltage $V_{IN}$ is sampled into the sampled voltage $V_S$ during the sampling phase. During the conversion phase, $D_{OC}$ is set to the calibrated value $D_{OCC}$, and a successive approximation process is conducted by the SAR FSM 270 to iteratively adapt the conversion code $D_C$ in accordance with the binary decision $D_E$ as follows. SAR FSM 270 increases $D_C$ to raise $V_C$ and thus lower $V_E$ when $D_E$ is 1, and otherwise decreases $D_C$ to lower $V_C$ and thus raise $V_E$. At the end of the conversion phase, $V_E$ is approximately equal to the offset voltage $V_{OS}$ of comparator 260 as a result of the successive approximation, and thus the conversion voltage $V_C$ is approximately equal to the input voltage $V_{IN}$, per Equation (1) along with the conditions that $V_S=V_{IN}$ (due to the sampling) and $V_{OC}=-V_{OS}$ (due to $D_{OC}$ being set to calibrated value $D_{OCC}$). Therefore, the conversion code $D_C$ can accurately represent the input voltage $V_{IN}$.

Figure 3:
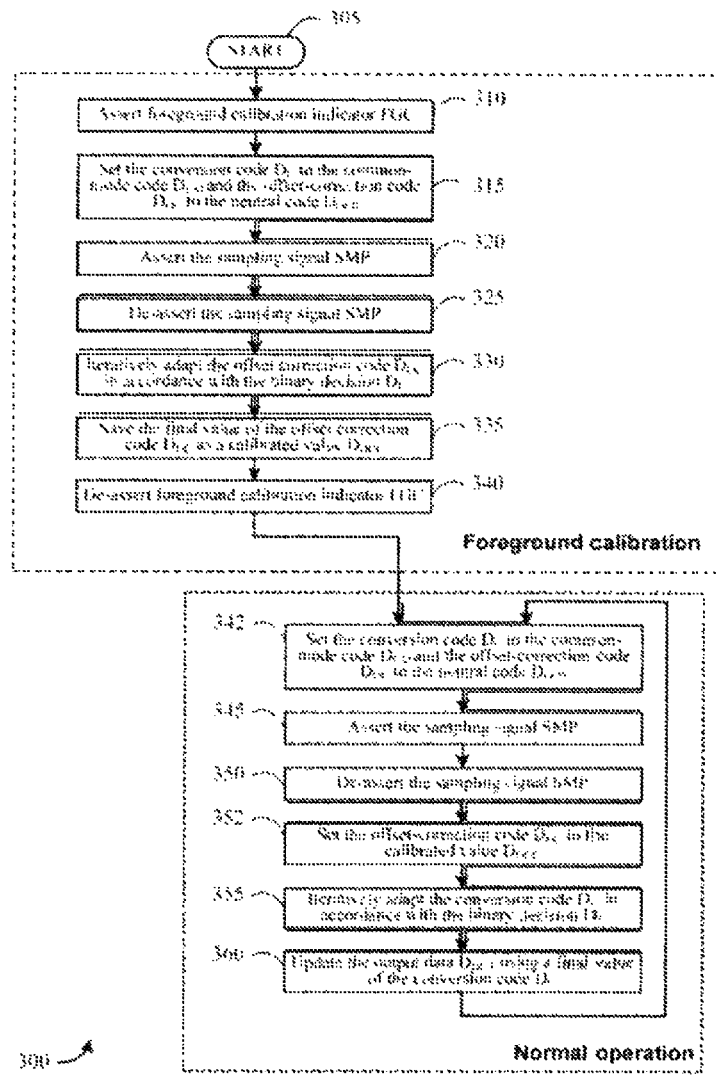
FIG. 3 shows a flow diagram of an SAR finite state machine for the SAR ADC of FIG. 2.

In an exemplary embodiment, SAR FSM 270 works in accordance with an algorithm illustrated by a flow diagram 300 shown in FIG. 3. Upon start up (step 305), SAR FSM 270 enters the foreground calibration state comprising the following steps: assert the foreground calibration indicator FGC (step 310); set the conversion code $D_C$ to the common-mode code $D_{CM}$ and the offset-correction code $D_{OC}$ to the neutral code $D_{OC0}$ (step 315); assert the sampling signal SMP (step 320); de-assert the sampling signal SMP (step 325); iteratively adapt the offset-correction code $D_{OC}$ in accordance with the binary decision $D_E$ (step 330); save the final value of the offset-correction code $D_{OC}$ as a calibrated value $D_{OCC}$ (step 335); and de-assert the foreground calibration indicator FGC (step 340). Then, SAR FSM 270 enters the normal operation state comprising the following steps: set the conversion code $D_C$ to the common-mode code $D_{CM}$ and the offset-correction code $D_{OC}$ to the neutral code $D_{OC0}$ (step 342); assert the sampling signal SMP (step 345); de-assert the sampling signal SMP (step 350); set the offset-correction code $D_{OC}$ to the calibrated value $D_{OCC}$ (step 352); iteratively adapt the conversion code $D_C$ in accordance with the binary decision $D_E$ (step 355); update the output data $D_{OUT}$ using a final value of the conversion code $D_C$ (step 360); and loop back to step 342. In step 330, a plurality of iterations are taken, wherein in each iteration, $D_{OC}$ is increased when $D_E$ is 1, and decreased otherwise. Likewise, in step 355, a plurality of iterations are taken, wherein in each iteration, $D_C$ is increased when $D_E$ is 1, and decreased otherwise.

Comparator 260 of FIG. 2 can be embodied by conventionally known comparator circuit at the discretion of circuit designer.

Figure 4:
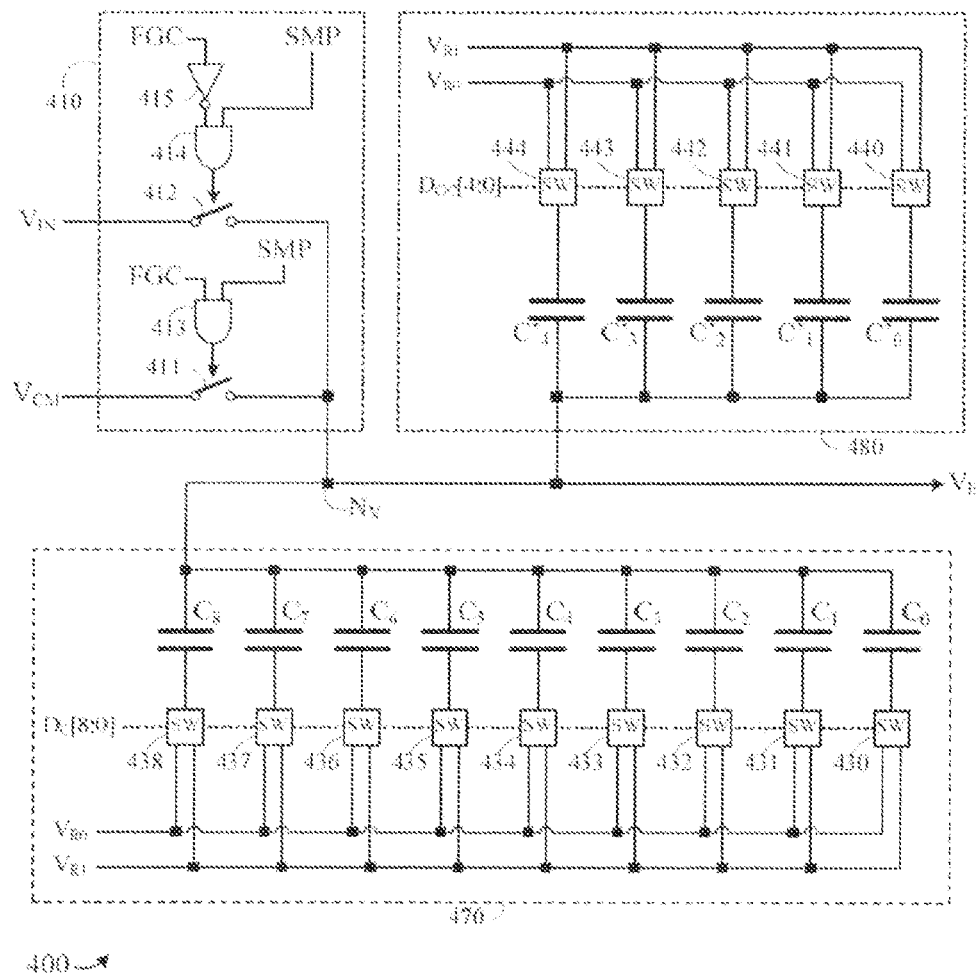
FIG. 4 shows a schematic diagram of a circuit embodiment for the SAR ADC of FIG. 2.

Note that FIG. 2 illustrates a functional block diagram that describes functions that embody SAR ADC in accordance with an example of the present invention. A function can be fulfilled in various means using various circuit embodiments at the discretion of circuit designer. A schematic diagram of a circuit 400 that can fulfill a combination of the functions of multiplexed sampling network 220, DAC 230, DAC 240, and summing circuit 250 of FIG. 2 is depicted in FIG. 4. The function of multiplexed network 220 of FIG. 2 is fulfilled by sub-circuit 410 of FIG. 4. The function of DAC 230 of FIG. 2 is fulfilled by sub-circuit 470 of FIG. 4; the function of DAC 240 of FIG. 2 is fulfilled by sub-circuit 480 of FIG. 4, and the function of summing circuit 250 of FIG. 2 is implied and fulfilled by using a common node $N_X$ for sub-circuit 410, sub-circuit 470, and sub-circuit 480 of FIG. 4. Sub-circuit 410 comprises two switches 411 and 412 for sampling $V_{CM}$ and $V_{IN}$, respectively, to the common node $N_X$. By using AND gate 413, switch 411 is turned on to sample the common-mode voltage $V_{CM}$ to the common node $N_X$ when both the sampling signal SMP and the foreground calibration indicator FGC are asserted, and turned off otherwise. By using AND gate 414 and inverter 415, switch 412 is turned on to sample the input voltage $V_{IN}$ to the common node $N_X$ when both the sampling signal SMP and the logical inversion of the foreground calibration indicator FGC are asserted, and turned off otherwise. The function of the multiplexed sampling network 220 of FIG. 2 is thus fulfilled by sub-circuit 410, and the sampled voltage $V_S$ of FIG. 2 is implied and stored at the common output node $N_X$ at the end of the sampling. In this exemplary embodiment, which is by way of example but not limitation, the conversion code $D_C$ is a 9-bit code denoted as $D_C[8:0]$, and the offset-correction code $D_{OC}$ is a 5-bit code denoted as $D_{OC}[4:0]$. Sub-circuit 470 comprises nine capacitors $C_0$, $C_1$, $C_2$, ..., $C_8$, and nine switches 430, 431, 432, ..., 438 controlled by the nine bits of the conversion code $D_C[8:0]$, respectively. Each of the nine capacitors couples the common node $N_X$ to either a first reference voltage $V_{R1}$ or a second reference voltage $V_{R0}$ via a respective switch controlled by a respective bit of the control code $D_C$. For instance, capacitor $C_0$ couples the common node $N_X$ to the first reference voltage $V_{R1}$ if $D_C[0]$ is 1, or to the second reference voltage $V_{R0}$ if $D_C[0]$ is 0, via switch 430. As a result, the conversion voltage $V_C$ is generated as a linear combination of the first reference voltage $V_{R1}$ and the second reference voltage $V_{R0}$ in accordance with the conversion code $D_C[8:0]$, and superimposed onto the common output node $N_X$. Sub-circuit 470 thus fulfills the function of DAC 230. Likewise, sub-circuit 480 comprises five capacitors $C'_0$, $C'_1$, $C'_2$, ..., $C'_4$, and five switches 440, 441, 442, ..., 444 controlled by the five bits of the offset-correction code $D_{OC}[4:0]$, respectively. Each of the five capacitors couples the common node $N_X$ to either the first reference voltage $V_{R1}$ or the second reference voltage $V_{R0}$ via a respective switch controlled by a respective bit of the offset correction code $D_{OC}[4:0]$. For instance, capacitor $C'_0$ couples the common node $N_X$ to the first reference voltage $V_{R1}$ if $D_{OC}[0]$ is 1, or to the second reference voltage $V_{R0}$ if $D_{OC}[0]$ is 0, via switch 440. As a result, the offset-correction voltage $V_{OC}$ is generated as a voltage of a linear combination of the first reference voltage $V_{R1}$ and the second reference voltage $V_{R0}$ in accordance with the offset-correction code $D_{OC}[4:0]$, and superimposed on the common node $N_X$. Sub-circuit 480 thus fulfills the function of DAC 240. By way of example but not limitation: $C_0=4$ fF; $C_1=8$ fF; $C_2=16$ fF; $C_3=32$ fF; $C_4=64$ fF; $C_5=128$ fF; $C_6=256$ fF; $C_7=512$ fF; $C_8=1024$ fF; $C'_0=2$ fF; $C'_1=4$ fF; $C'_2=8$ fF; $C'_3=16$ fF; $C'_4=32$ fF; $D_{OC0}=5'b1,0000$; $D_{CM}=9'b1,0000,0000$; $V_{CM}=0$; $V_{R1}=-0.5V$; and $V_{R0}=0.5V$. Note that in this exemplary embodiment, the resolution of DAC 240 is higher than DAC 230 due to using smaller capacitors ($C'_0$ is smaller than $C_0$; $C'_1$ is smaller than $C_1$; $C'_2$ is smaller than $C_2$; and so on). Using this arrangement, the offset voltage $V_{OS}$ of comparator 260 can be calibrated to be smaller than a least-significant bit of DAC 230.

Referring to FIG. 2, in the normal operation state, the offset-correction code $D_{OC}$ is set to the calibrated value $D_{OCC}$ in the conversion phase. If the offset voltage $V_{OS}$ of comparator 260 stays unchanged, then the offset voltage $V_{OS}$ of comparator 260 can be effectively corrected by DAC 240. However, if the offset voltage $V_{OS}$ of comparator 260 changes over time, then the offset voltage $V_{OS}$ of comparator 260 may not be effectively corrected by DAC 240. In this case, a background calibration is needed. The background calibration is based on statistics of the output data $D_{OUT}$. In an embodiment, the common-mode voltage $V_{CM}$ is equal to a statistical mean of the input voltage $V_{IN}$. If the offset voltage $V_{OS}$ of comparator 260 is effectively corrected by DAC 240, then a statistical mean of the output data $D_{OUT}$ will be equal to the common-mode code $D_{CM}$. If the statistical mean of the output data $D_{OUT}$ is greater than the common-mode code $D_{CM}$, it indicates the calibrated value $D_{OCC}$ is too low and needs to be increased. Otherwise, it indicates the calibrated value $D_{OCC}$ is too high and needs to be decreased.

Those skilled in the art will readily observe that numerous modifications and alterations of the device and method may be made while retaining the teachings of the invention. Accordingly, the invention should not be limited by the exemplary embodiments, but is described by the appended claims and equivalents thereof.

What is claimed is:

1. A circuit comprising:
   a multiplexed sampling network sampling either an input voltage or a common-mode voltage into a sampled voltage in accordance with a sampling signal and a status of a foreground calibration indicator;
   a first digital-to-analog converter outputting a conversion voltage in response to a conversion code;
   a second digital-to-analog converter outputting an offset-correction voltage in response to an offset-correction code;
   a summing circuit receiving the sampled voltage, the conversion voltage, and the offset-correction voltage and outputting an error voltage;
   a comparator receiving the error voltage and outputting a binary decision; and
   a successive-approximation-register finite state machine receiving the binary decision and outputting an output data, the sampling signal, the foreground calibration indicator, the conversion code, and the offset-correction code,
   wherein the finite stage machine includes a foreground calibration state and a normal operation state;
   wherein when the finite state machine operates in the foreground calibration state, the common-mode voltage is sampled, the conversion code is set to a common-mode code, and a calibrated value of the offset-correction code is established by successive approximation and
   wherein when the finite state machine is in the normal operation state, the input voltage is sampled, the offset-correction code is set to the calibrated value, and the conversion code is established by successive approximation.

2. The circuit of claim 1, wherein the common-mode voltage is equal to a statistical mean of the input voltage.

3. The circuit of claim 1, wherein a value of the conversion voltage in response to the common-mode code is approximately equal to the common-mode voltage.

4. The circuit of claim 3, wherein a value of the offset-correction voltage in response to the calibrated value of the offset-correction code is approximately equal to an offset voltage of the comparator.

5. The circuit of claim 1, wherein the output data comprises a final value of the conversion code at the end of the successive approximation in the normal operation mode.

6. The circuit of claim 5, wherein the calibrated value of the offset-correction code is adapted based on a statistical mean of the output data in the normal operation mode.

7. The circuit of claim 1, wherein the first digital-to-analog converter comprises a plurality of capacitors, each of said capacitors comprising a first end and a second end, the first end being coupled to a common node, and the second end being coupled to one of a first reference voltage and a second reference voltage in accordance with a respective bit of the conversion code.

8. The circuit of claim 1, wherein the second digital-to-analog converter comprises a plurality of capacitors, each of said capacitors comprising a first end and a second end, the first end being coupled to a common node, and the second end being coupled to one of a first reference voltage and a second reference voltage in accordance with a respective bit of the offset-correction code.

9. The circuit of claim 1, wherein a resolution of the second digital-to-analog converter is higher than a resolution of the first digital-to-analog converter.

10. A method comprising:
    using a first digital-to-analog converter to generate a conversion voltage in response to a conversion code;
    using a second digital-to-analog converter to generate an offset-correction voltage in response to an offset-correction code;
    using a summing circuit to generate an error voltage representing a sum of a sampled voltage, the conversion voltage, and the offset-correction voltage;
    using a comparator to generate a binary decision indicating a polarity of the error voltage;
    performing a first successive approximation including:
    setting the conversion code to a common-mode code;
    setting the offset-correction code to a neutral code;
    sampling a common-mode voltage into the sampled voltage;
    iteratively adapting the offset-correction code in accordance with the binary decision using successive approximation; and
    saving a final value of the offset-correction code as a calibrated value;
    performing a second successive approximation including:
    setting the offset-correction code to the neutral code;
    setting the conversion code to the common-mode code;
    sampling an input voltage into the sampled voltage;
    setting the offset-correction code to the calibrated value; and
    iteratively adapting the conversion code in accordance with the binary decision using successive approximation; and
    outputting an output data using a final value of the conversion code.

11. The method of claim 10, wherein iteratively adapting the offset-correction code in accordance with the binary decision using successive approximation comprises: conducting a plurality of iterations, each of said iterations increases a value of the offset-correction code when the binary decision is one, or otherwise decreases the value of the offset-correction code.

12. The method of claim 10, wherein iteratively adapting the conversion code in accordance with the binary decision using successive approximation comprises: conducting a plurality of iterations, each of said iterations increases a value of the conversion code when the binary decision is one or otherwise decreases the value of the conversion code.

13. The method of claim 10, wherein a value of the conversion voltage in response to the common-mode code is approximately equal to the common-mode voltage.

14. The method of claim 10, wherein a value of the offset-correction voltage in response to the calibrated value of the offset-correction code is approximately equal to an offset voltage of the comparator.

15. The method of claim 10, wherein the first digital-to-analog converter comprises a plurality of capacitors, each of said capacitors comprising a first end and a second end, said method including coupling the first end to a common node and coupling the second end to either a first reference voltage or a second reference voltage in accordance with a respective bit of the conversion code.

16. The method of claim 10, wherein the second digital-to-analog converter comprises a plurality of capacitors, each of said capacitors comprising a first end and a second end, said method including the first end coupling to a common node and coupling the second end to either a first reference voltage or a second reference voltage in accordance with a respective bit of the offset-correction code.

17. The method of claim 10, wherein a resolution of the second digital-to-analog converter is higher than a resolution of the first digital-to-analog converter.

18. The method of claim 10 further comprising: adapting the calibrated value of the offset-correction code based on a statistical mean of the output data.

* * * * *